(12) United States Patent
Deshpande et al.

(10) Patent No.: US 9,464,224 B2
(45) Date of Patent: *Oct. 11, 2016

(54) TRANSFORMATIVE WAVELENGTH CONVERSION MEDIUM

(71) Applicants: Rohm and Haas Electronic Materials LLC, Marlborough, MA (US); Dow Global Technologies LLC, Midland, MI (US)

(72) Inventors: Kishori Deshpande, Lake Jackson, TX (US); Robert E. Hefner, Jr., Rosharon, TX (US); Peter Trefonas, Medway, MA (US); Maurice J. Marks, Lake Jackson, TX (US); Jong Keun Park, Westborough, MA (US); Jieqian Zhang, Southborough, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 21 days.

This patent is subject to a terminal disclaimer.

(21) Appl. No.: 14/550,265

(22) Filed: Nov. 21, 2014

(65) Prior Publication Data

US 2015/0166885 A1    Jun. 18, 2015

Related U.S. Application Data

(60) Provisional application No. 61/917,698, filed on Dec. 18, 2013.

(51) Int. Cl.

| | |
|---|---|
| H05B 33/04 | (2006.01) |
| C08L 63/00 | (2006.01) |
| C08K 3/10 | (2006.01) |
| C09K 11/02 | (2006.01) |
| H01L 33/50 | (2010.01) |

(52) U.S. Cl.
CPC .............. *C09K 11/02* (2013.01); *H01L 33/502* (2013.01); *Y02B 20/181* (2013.01)

(58) Field of Classification Search
None
See application file for complete search history.

(56) References Cited

U.S. PATENT DOCUMENTS

| | | | |
|---|---|---|---|
| 8,318,834 B2 | 11/2012 | Hefner, Jr. et al. | |
| 8,455,898 B2 | 6/2013 | Anc | |
| 2003/0135059 A1 | 7/2003 | Matsumura et al. | |
| 2003/0168652 A1* | 9/2003 | Mabuchi ............ | C08G 59/1405 257/13 |
| 2008/0173886 A1 | 7/2008 | Cheon et al. | |
| 2011/0039982 A1 | 2/2011 | Hefner, Jr. et al. | |
| 2011/0279017 A1* | 11/2011 | Li ...................... | C09K 11/0883 313/503 |
| 2013/0005853 A1 | 1/2013 | Morley et al. | |
| 2013/0065986 A1* | 3/2013 | Sato ..................... | C08G 59/226 523/427 |
| 2013/0178590 A1 | 7/2013 | Jin et al. | |
| 2013/0241086 A1 | 9/2013 | Sakane | |
| 2013/0241088 A1 | 9/2013 | Onai | |
| 2013/0256863 A1 | 10/2013 | Ito | |
| 2015/0166884 A1* | 6/2015 | Hefner, Jr. ............ | H05B 33/04 313/512 |

FOREIGN PATENT DOCUMENTS

WO    WO 2012/020625 A1 *    2/2012    ............. C08G 59/20

OTHER PUBLICATIONS

Copending U.S. Appl. No. 14/550,216.
Zhao, et al., High-Temperature Luminescene Quenching of Colloidal Quantum Dots, ACSNANO, vol. 6, No. 10, pp. 9058-9067 (2012).

* cited by examiner

*Primary Examiner* — Michael J Feely
(74) *Attorney, Agent, or Firm* — Thomas S. Deibert

(57) ABSTRACT

A transformative wavelength conversion medium is provided, comprising: a phosphor; and, a curable liquid component, wherein the curable liquid component, comprises: an aliphatic resin component, wherein the aliphatic resin component has an average of two epoxide groups per molecule; and, a curing agent; wherein the curable liquid component contains less than 0.5 wt % of monoepoxide molecules (based on the total weight of the aliphatic resin component); and, wherein the curable liquid component is a liquid at 25° C. and atmospheric pressure; and, wherein the phosphor is dispersed in the curable liquid component.

7 Claims, No Drawings

TRANSFORMATIVE WAVELENGTH CONVERSION MEDIUM

This application claims priority to U.S. Provisional Application No. 61/917,698 filed on Dec. 18, 2013.

The present invention relates to a transformative wavelength conversion medium, comprising: a phosphor, and, a curable liquid component, wherein the curable liquid component, comprises: an aliphatic resin component, wherein the aliphatic resin component has an average of two epoxide groups per molecule; and, a curing agent; wherein the curable liquid component contains less than 0.5 wt % of monoepoxide molecules (based on the total weight of the aliphatic resin component); and, wherein the curable liquid component is a liquid at 25° C. and atmospheric pressure; wherein the phosphor is dispersed in the curable liquid component. The present invention further relates to a lighting device.

Phosphor converted light emitting diode lighting devices use a phosphor (e.g., YAG) or mixture of phosphors to convert some or all of the light emitted by a blue or ultraviolet light emitting semiconductor diode light source (e.g., GaN chip) to provide, for example, white light. The conversion of the source luminescence spectrum produced by the GaN chip to longer wavelengths by a phosphor is commonly referred to as a down-conversion of the source emission. An unconverted portion of the source luminescent spectrum combines with the light of longer wavelength emitted by the phosphor to produce white light. Such devices are of increasing importance given their improved energy efficiency compared to more conventional lighting devices.

Phosphor converted light emitting diode lighting devices (pcLEDs) typically comprises an LED die light source that is encapsulated with an optically clear and thermally stable material. The encapsulating material generally serves at least one of three functions, namely (1) it facilitates incorporation of the light source into a device; (2) it provides protection for the fragile wiring for the light source; and (3) it behaves as a refractive intermediary between the high index die and low index air. In some pcLED devices, a preformed plastic lens or glass lens is affixed or bonded to a package in which the LED light source die is mounted. A curable liquid encapsulant material containing a phosphor is then injected into the cavity between the LED die and the plastic lens (or glass lens) and is subsequently cured to completely seal the LED die.

There is an increasing trend of directly molding a phosphor loaded curable liquid encapsulant material onto an LED die using an in-line molding process. In these in-line molding processes, a curable liquid encapsulant material loaded with a phosphor is injected or potted into a mold cavity containing a LED die (or into which an LED die is immersed) and then curing the encapsulant material, wherein the encapsulant material both encapsulates the LED die, encapsulates the phosphor, and forms a lens for shaping the light emitted from the LED die. Such in-line molding processes eliminate the prefabrication and assembly of a lens into the pcLED device. As a result, such in-line molding processes promise more cost effective high volume manufacturing of pcLED devices.

Accordingly, curable materials are of interest as lens, phosphor carriers and encapsulant materials for use in pcLED device applications. For example, in the manufacture of pcLED devices, manufacturers desire optical materials with high transparency in the visible region, high phosphor loading capacity, and excellent heat stability over tens of thousands of hours of operation. Additionally the pcLED device industry uses liquid transformative wavelength conversion mediums, which are then cured in place after much of the device has already been assembled. Therefore the curing polymer system must be curable under conditions which do not harm the assembled device.

Materials conventionally used to encapsulate LED dies include epoxy resins and silicones. Conventional epoxy resins tend to exhibit poor light stability (i.e., they yellow) over time following exposure to ultraviolet light or to elevated thermal conditions. This yellowing leads to an overall reduction in the light output and to an undesired spectrum modification in light output from the pcLED device over time. Conventional silicones exhibit better heat and light stability. As a result, silicones are becoming the dominant encapsulant for use in pcLED devices. Conventional silicone encapsulants; however, exhibit undesirable refractive indices ranging from 1.41 to 1.57 (measured at 550 nm). Moreover, it has proven difficult to achieve refractive indices of higher than about 1.6 (measured at 550 nm) in silicon systems without compromising other key performance properties such as flowability in the uncured state.

One group of curable liquids for use in LED devices is disclosed by Conner et al. in United States Patent Application Publication No. 2009/0039313. Conner et al. disclose a (thio)phenoxyphenyl phenyl silane composition comprising a (thio)phenoxyphenyl phenyl silane having formula I

$$Ph^2\text{-}Q\text{-}Ph_1\text{-}Si(Ph^3)(OR)_2 \qquad (I)$$

wherein: $Ph^1$ is a phenyl ring having $Ph^2$-Q-, —$Si(Ph^3)(OR)$ and four hydrogen atoms as substituents; $Ph^2$-Q is a (thio)phenoxy group where $Ph^2$ is phenyl and Q is selected from oxygen atom, sulfur atom, and combinations thereof; $Ph^2$-Q is in a position on the $Ph^1$ phenyl ring which is ortho-, meta-, or para-relative to the Si atom; $Ph^3$ is phenyl; and R is independently selected from a hydrogen atom, a $C_{1-10}$ hydrocarbon radical, and combinations thereof; wherein the $C_{1-10}$ hydrocarbon radical is independently selected from: linear, branched, or cyclic $C_{1-10}$ alkyl; phenyl; substituted phenyl; arylalkyl; and combinations thereof.

Notwithstanding, there remains a need for curable transparent materials for use in the manufacture of lighting devices. In particular, there remains a need for curable liquid components having a low viscosity in the uncured state, good thermal stability, transparency and which are capable of incorporating a phosphor for use in pcLED lighting devices.

The present invention provides a transformative wavelength conversion medium, comprising: a phosphor; and, a curable liquid component, wherein the curable liquid component, comprises: an aliphatic resin component, wherein the aliphatic resin component has an average of two epoxide groups per molecule; and, a curing agent; wherein the curable liquid component contains less than 0.5 wt % of monoepoxide molecules (based on the total weight of the aliphatic resin component); and, wherein the curable liquid component is a liquid at 25° C. and atmospheric pressure; and, wherein the phosphor is dispersed in the curable liquid component.

The present invention provides a transformative wavelength conversion medium, comprising: a phosphor; and, a curable liquid component, wherein the curable liquid component, comprises: an aliphatic resin component, wherein the aliphatic resin component has an average of two epoxide groups per molecule; and, a curing agent; wherein the curable liquid component contains less than 0.09 wt % of monoepoxide molecules (based on the total weight of the aliphatic resin component); wherein the curable liquid component contains less than 1 wt % of polyepoxide molecules containing at least three epoxide groups per molecule (based on the total weight of the aliphatic resin component); and, wherein the curable liquid component is a liquid at 25° C. and atmospheric pressure; wherein the phosphor is dispersed in the curable liquid component.

The present invention provides a transformative wavelength conversion medium, comprising: a phosphor; and, a curable liquid component, wherein the curable liquid component, comprises: an aliphatic resin component, wherein the aliphatic resin component has an average of two epoxide groups per molecule; and, a curing agent, wherein the curing agent is selected from the group consisting of catalytic curing agents, co-reactive curing agents and mixtures thereof; wherein the curable liquid component contains less than 0.09 wt % of monoepoxide molecules (based on the total weight of the aliphatic resin component); wherein the curable liquid component contains less than 1 wt % of polyepoxide molecules containing at least three epoxide groups per molecule (based on the total weight of the aliphatic resin component); and, wherein the curable liquid component is a liquid at 25° C. and atmospheric pressure; wherein the phosphor is dispersed in the curable liquid component.

The present invention provides a transformative wavelength conversion medium, comprising: a phosphor, and, a curable liquid component, wherein the curable liquid component, comprises: an aliphatic resin component, wherein the aliphatic resin component contains ≥95 wt % of alicyclic diepoxide molecules having at least one alicyclic skeleton per molecule; wherein the alicyclic diepoxide molecules having at least one alicyclic skeleton per molecule are selected from the group consisting of diglycidyl ethers of molecules according to formula (I)

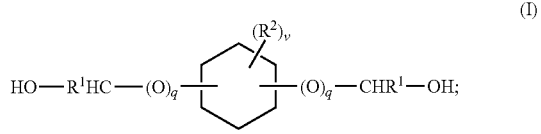

mixtures thereof; and, a curing agent; wherein the curable liquid component contains less than 0.09 wt % of monoepoxide molecules (based on the total weight of the aliphatic resin component); wherein the curable liquid component contains less than 1 wt % of polyepoxide molecules containing at least three epoxide groups per molecule (based on the total weight of the aliphatic resin component); and, wherein the curable liquid component is a liquid at 25° C. and atmospheric pressure; wherein the phosphor is dispersed in the curable liquid component.

The present invention provides a transformative wavelength conversion medium, comprising: a phosphor; and, a curable liquid component, wherein the curable liquid component, comprises: an aliphatic resin component, wherein the aliphatic resin component contains ≥95 wt % of alicyclic diepoxide molecules selected from the group consisting of a diglycidyl ether of cis-1,3-cyclohexanedimethanol; a diglycidyl ether of trans-1,3-cyclohexanedimethanol; a diglycidyl ether of cis-1,4-cyclohexanedimethanol; a diglycidyl ether of trans-1,4-cyclohexanedimethanol; and, mixtures thereof; and, a curing agent; wherein the curable liquid component contains less than 0.09 wt % of monoepoxide molecules (based on the total weight of the aliphatic resin component); wherein the curable liquid component contains less than 1 wt % of polyepoxide molecules containing at least three epoxide groups per molecule (based on the total weight of the aliphatic resin component); and, wherein the curable liquid component is a liquid at 25° C. and atmospheric pressure; wherein the phosphor is dispersed in the curable liquid component.

The present invention provides a lighting device, comprising: a light source, wherein the light source produces light having a source luminescence spectrum; a phosphor; and, a cured curable liquid component, wherein the curable liquid component, comprises, as initial components: an aliphatic resin component, wherein the aliphatic resin component has an average of two epoxide groups per molecule; and, a curing agent; wherein the curable liquid component contains less than 0.5 wt % of monoepoxide molecules (based on the total weight of the aliphatic resin component); and, wherein the curable liquid component is a liquid at 25° C. and atmospheric pressure; and, wherein the phosphor is radiationally coupled to the light source.

The present invention provides a lighting device, comprising: a light source, wherein the light source produces light having a source luminescence spectrum; and, an active layer, wherein the active layer comprises a transformative wavelength conversion medium of the present invention in a cured state; wherein the phosphor is radiationally coupled to the light source.

DETAILED DESCRIPTION

The transformative wavelength conversion medium of the present invention include a phosphor dispersed in a curable liquid component, wherein the curable liquid component is capable of undergoing a curing reaction upon exposure to at least one of thermal energy and photonic energy, wherein the curable liquid component transforms upon curing from a liquid to a cured solid via an addition reaction (i.e., essentially no off gassing and no fugitive curing byproducts produced). The curable liquid component used in the transformative wavelength conversion medium of the present invention particularly lends itself for use in the phosphor converted light emitting diode (pcLED) devices. In many pcLED devices, special requirements are presented given that a partially or completely closed space must be filled with the transformative wavelength conversion medium. In such applications, the transformative wavelength conversion medium, wherein the curable liquid component is in an uncured (liquid) state is dispensed or injected into the mold cavity and is then cured. In such molding processes, it is desirable to minimize the content of volatiles in the transformative wavelength conversion medium used to avoid the need to facilitate off gassing; removal of a solvent; or, removal of fugitive curing byproducts from the system. In such molding processes, it is also desirable for the transformative wavelength conversion medium used to exhibit a very low viscosity to facilitate rapid wet out, degassing and mold filling.

The term "light source" used herein and in the appended claims means any source of light capable of exciting or irradiating a phosphor directly or indirectly (i.e., the light source can either excite or irradiate the phosphor directly, or excite another substance which then provides the excitation or irradiation energy to the phosphor.

The term "phosphite ester" used herein and in the appended claims means a chemical compound having the general formula $P(OR)_3$, wherein R is selected from a second bond to the P (i.e., wherein the oxygen atom has two bonds to the P) and a carbon containing moiety. Examples of phosphite esters include 9,10-dihydro-9-oxa-10-phosphaphenanthrene-10-oxide; bis(2,6-di-t-butyl-4-methylphenyl)pentaerythritol diphosphite; bis(2,4-di-t-butylphenyl) pentaerythritol diphosphite; tris(2,4-di-t-butylphenyl) phosphite; tris(monononylphenyl)phosphite; tris (dinonylphenyl)phosphite; tris(2-ethylhexyl)phosphite; triphenyl phosphite; tris(monononylphenyl)phosphite; and, trisisodecyl phosphite.

The transformative wavelength conversion medium of the present invention, preferably comprises: a phosphor; and, a curable liquid component, wherein the curable liquid component, comprises: an aliphatic resin component, wherein the aliphatic resin component has an average of two epoxide groups per molecule; and, a curing agent (preferably, wherein the curing agent is selected from the group consisting of catalytic curing agents, co-reactive curing agents and mixtures thereof); wherein the curable liquid component contains less than 1 wt % (preferably, ≤0.5 wt %; more preferably, ≤0.3 wt %; still more preferably, ≤0.09 wt %; yet still more preferably, ≤0.01 wt %; most preferably, <the lower detectable limit) of monoepoxide molecules (based on the total weight of the aliphatic resin component); and, wherein the curable liquid component is a liquid at 25° C. and atmospheric pressure; wherein the phosphor is dispersed in the curable liquid component.

The transformative wavelength conversion medium of the present invention, preferably comprises: a phosphor; and, a curable liquid component, wherein the curable liquid component, comprises: an aliphatic resin component, wherein the aliphatic resin component has an average of two epoxide groups per molecule; and, a curing agent (preferably, wherein the curing agent is selected from the group consisting of catalytic curing agents, co-reactive curing agents and mixtures thereof); wherein the curable liquid component contains less than 1 wt % (preferably, ≤0.5 wt %; more preferably, ≤0.3 wt %; still more preferably, ≤0.09 wt %; yet still more preferably, ≤0.01 wt %; most preferably, <the lower detectable limit) of monoepoxide molecules (based on the total weight of the aliphatic resin component); wherein the curable liquid component contains less than 1 wt % (preferably, ≤0.5 wt %; more preferably, ≤0.01 wt %; still more preferably, ≤0.001 wt %; most preferably, <the lower detectable limit) of polyepoxide molecules containing at least three epoxide groups per molecule (based on the total weight of the aliphatic resin component); and, wherein the curable liquid component is a liquid at 25° C. and atmospheric pressure; wherein the phosphor is dispersed in the curable liquid component.

The phosphor used in the transformative wavelength conversion medium of the present invention is preferably selected from substances that exhibit the phenomenon of luminescence (i.e., the emission of light by a substance not resulting from heat). Preferably, the phosphor used absorbs light having a given source luminescence spectrum and reemits light having a different luminescence spectrum. More preferably, the phosphor used in the transformative wavelength conversion medium is selected from the group consisting of a quantum dot and an oxycarbonitride phosphor.

The quantum dots used in the transformative wavelength conversion medium of the present invention preferably are selected from nanocrystals of a semiconductor material, wherein the nanocrystals have excitons that are confined in all three spatial dimensions. Preferably, the semiconductor materials are selected from the group including Group II-VI semiconductors (e.g., ZnS, ZnSe, ZnTe, CdS, CdSe, CdTe, HgS, HgSe, HgTe); Group III-V semiconductors (e.g., GaN, GaP, GaAs, GaSb, InN, InP, InAs, InSb, AlAs, AlP, AlSb); Group IV semiconductors (e.g., Ge, Si, Pb); and, combinations thereof.

The oxycarbonitride phosphors used in the transformative wavelength conversion medium of the present invention are preferably are selected from materials having a formula

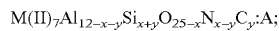
$M(II)_7Al_{12-x-y}Si_{x+y}O_{25-x}N_{x-y}C_y{:}A;$

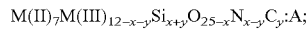
$M(II)_7M(III)_{12-x-y}Si_{x+y}O_{25-x}N_{x-y}C_y{:}A;$

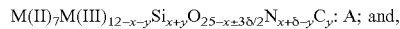
$M(II)_7M(III)_{12-x-y}Si_{x+y}O_{25-x\pm3\delta/2}N_{x+\delta-y}C_y{:}\ A;$ and,

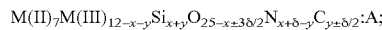
$M(II)_7M(III)_{12-x-y}Si_{x+y}O_{25-x\pm3\delta/2}N_{x+\delta-y}C_{y\pm\delta/2}{:}A;$ wherein 0<x<12; wherein 0<y<x: wherein 0<x+y≤12 (preferably, wherein x+y=12); wherein 0<δ≤3; wherein <x+y; wherein M(II) comprises at least one divalent cation (preferably, wherein M(II) is selected from the group consisting of at least one of Be, Mg, Ca, Sr, Ba, Cu, Co, Ni, Pd, Zn and Cd; more preferably, wherein M(II) is selected from the group consisting of at least one of Mg, Ca, Sr and Ba); wherein M(III) comprises at least one trivalent cation (preferably, wherein M(III) is selected from the group consisting of at least one of B, Al, Ga, In, Sc, Y, La and Gd; more preferably, wherein M(III) is selected from the group consisting of at least one of B and Al; most preferably, wherein M(III) is Al); and, wherein A is a luminescence activator (preferably, wherein A is at least one ion selected from the group consisting of Ce, Pr, Nd, Sm, Eu, Gd, Tb, Dy, Ho, Er, Tm, Yb, Lu, Mn, Bi and Sb; more preferably, wherein A is selected from the group consisting of $Eu^{2+}$, $Ce^{3+}$, $Tb^{3+}$, $Yb^{2+}$ and $Mn^{2+}$; most preferably, wherein A is $Eu^{2+}$).

Preferably, the curable liquid component used in the transformative wavelength conversion medium of the present invention contains less than 1 wt % (preferably, ≤0.5 wt %; more preferably, ≤0.3 wt %; still more preferably, ≤0.09 wt %; yet still more preferably, ≤0.01 wt %; most preferably, <the lower detectable limit) of monoepoxide molecules (based on the total weight of the aliphatic resin component). More preferably, the curable liquid component used in the transformative wavelength conversion medium of the present invention contains less than 1 wt % (preferably, ≤0.5 wt %; more preferably, ≤0.3 wt %; still more preferably, ≤0.09 wt %; yet still more preferably, ≤0.01 wt %; most preferably, <the lower detectable limit) of monoepoxide molecules (based on the total weight of the aliphatic resin component); and, less than 1 wt % (preferably, ≤0.5 wt %; more preferably. ≤0.01 wt %; still more preferably, ≤0.001 wt %; most preferably, <the lower detectable limit) of polyepoxide molecules containing at least three epoxide groups per molecule (based on the total weight of the aliphatic resin component). Most preferably, the curable liquid component used in the transformative wavelength conversion medium of the present invention contains ≤0.09 wt % of monoepoxide molecules (based on the total weight of the aliphatic resin component); and, ≤0.01 wt % of polyepoxide molecules containing at least three epoxide groups per molecule (based on the total weight of the aliphatic resin component).

Preferably, the curable liquid component used in the transformative wavelength conversion medium of the present invention contains <0.001 wt % (more preferably, <0.00001 wt %; most preferably, <the lower detectable limit) of silica. Preferably, the aliphatic resin component used in the transformative wavelength conversion medium of the present invention contains <0.001 wt % (more preferably, <0.00001 wt %; most preferably, <the lower detectable limit) of phosphite ester. Preferably, the transformative wavelength conversion medium of the present invention contains <0.001 wt % (more preferably, <0.00001 wt %; most preferably, <the lower detectable limit) of silica. Preferably, the aliphatic resin component used in the transformative wavelength conversion medium of the present invention contains <0.001 wt % (more preferably, <0.00001 wt %; most preferably, <the lower detectable limit) of phosphite ester.

Preferably, the curable liquid component used in the transformative wavelength conversion medium of the present invention when in a cured state is transparent to light in the visible spectrum. More preferably, the curable liquid component used in the transformative wavelength conversion medium of the present invention when in a cured state exhibits a % total transmittance, % $T_T$, at 450 nm of ≥90% (measured under the conditions set forth in the Examples).

Preferably, the curable liquid component used in the transformative wavelength conversion medium of the present invention when in a cured state is non-yellowing. More preferably, the curable liquid component used in the transformative wavelength conversion medium of the present invention when in a cured state exhibits a yellowness index (YI) of ≤20 (still more preferably, ≤10; most preferably, ≤5) (measured under the conditions set forth in the Examples). Most preferably, the curable liquid component used in the transformative wavelength conversion medium when in a cured state exhibits thermal non-yellowing stability. The term "thermal non-yellowing stability" used herein and in the appended claims means that the curable liquid component following exposure to thermal energy when in a cured state by placing in a convection oven set at 125° C. for a period of 7 days exhibits a yellowness index (YI) of ≤20 (still more preferably, ≤10; most preferably, ≤5) (measured under the conditions set forth in the Examples). Optionally, the aliphatic resin component used in the curable liquid component can be treated to remove any undesirable color that may be present. For example, a decolorizing agent can, optionally, (1) be dispersed in the aliphatic resin component; and then, (2) be removed from the aliphatic resin component by filtration. Decolorizing agents can include, for example, an activated carbon (e.g., powder or pellet form); clays, ion exchange resins, and sodium borohydride.

The aliphatic resin component used in the transformative wavelength conversion medium of the present invention has an average of two epoxide groups per molecule. Preferably, the aliphatic resin component used in the transformative wavelength conversion medium of the present invention has an average of two primary carbon atom containing epoxide groups per molecule.

Preferably, the aliphatic resin component used in the transformative wavelength conversion medium of the present invention contains ≥50 wt % of alicyclic diepoxide molecules having at least one alicyclic skeleton per molecule. More preferably, the aliphatic resin component used in the transformative wavelength conversion medium of the present invention contains ≥95 wt % of alicyclic diepoxide molecules having at least one alicyclic skeleton per molecule. Still more preferably, the aliphatic resin component used in the transformative wavelength conversion medium of the present invention contains ≥98.0 wt % (most preferably, ≥99.0 wt %) of alicyclic diepoxide molecules having at least one alicyclic skeleton per molecule.

Alicyclic diepoxide molecules having at least one alicyclic skeleton per molecule used in the transformative wavelength conversion medium of the present invention are preferably selected from the group consisting of diglycidyl ethers of molecules according to formula (I)

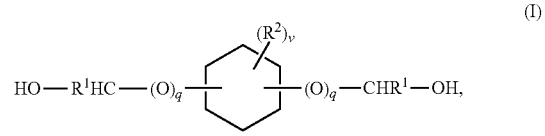

molecules according to formula (II)

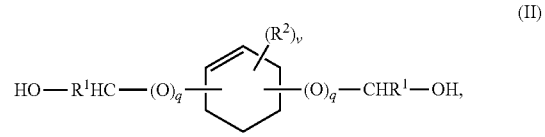

molecules according to formula (III)

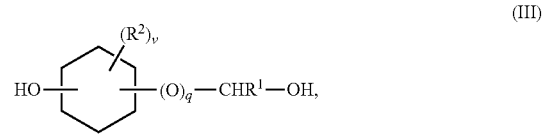

molecules according to formula (IV)

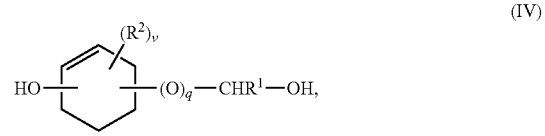

molecules according to formula (V)

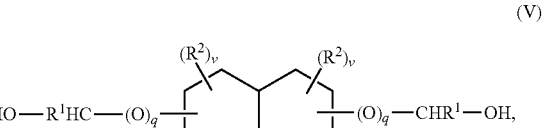

molecules according to formula (VI)

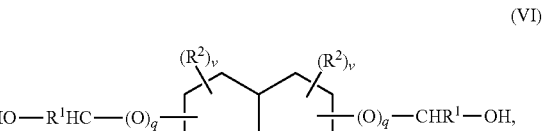

molecules according to formula (VII)

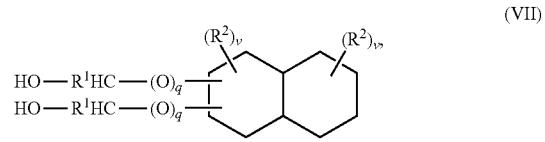

molecules according to formula (VIII)

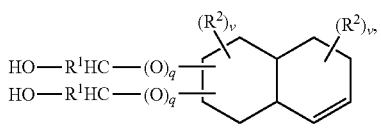
(VIII)

molecules according to formula (IX)

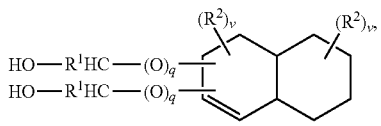
(IX)

molecules according to formula (X)

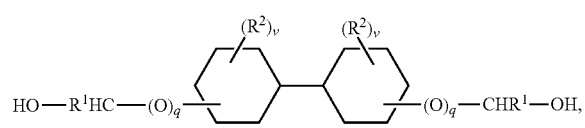
(X)

molecules according to formula (XI)

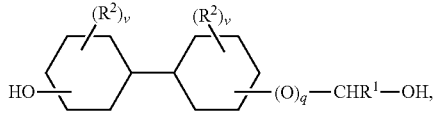
(XI)

molecules according to formula (XII)

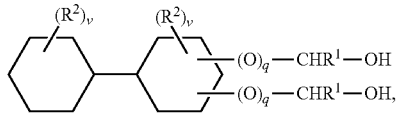
(XII)

molecules according to formula (XIII)

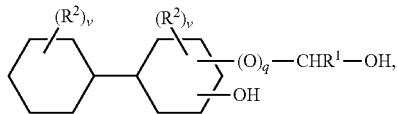
(XIII)

molecules according to formula (XIV)

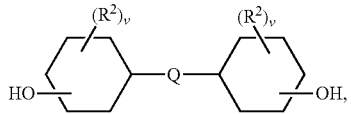
(XIV)

and, mixtures thereof, wherein each $R^1$ is independently selected from the group consisting of a H, a $C_{1-6}$ hydrocarbyl group and a $C_{1-6}$ hydrocarbylene group (preferably, a $C_{1-6}$ hydrocarbylene group); wherein each $R^2$ is independently selected from the group consisting of a $C_{1-12}$ hydrocarbyl group, a $C_{1-12}$ alkoxy group and a $C_{1-12}$ oxo organyl group (preferably, a $C_{1-12}$ alkyl group, $C_{1-12}$ alkoxy group, a $C_{3-12}$ cycloalkyl group and a $C_{3-12}$ cycloalkoxy group); wherein Q is a bridging group selected from the group consisting of $C_{1-12}$ alkylene group (saturated divalent aliphatic hydrocarbon radical), an arylene group, an oxygen, a sulfur, an —O═S—O— group; an —S(O)— group, an —C(O)— group, an —($R^3$)N(C═O)— group (where $R^3$ is selected from the group consisting of a hydrogen, a $C_{1-6}$ alkyl group); wherein each q is independently selected from the group consisting of 0 and 1; and, wherein each v is independently selected from the group consisting of 0, 1 and 2. More preferably, alicyclic diepoxide molecules having at least one alicyclic skeleton per molecule used in the transformative wavelength conversion medium of the present invention are selected from the group consisting of diglycidyl ethers of molecules according to formula (I)

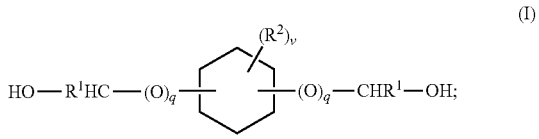
(I)

mixtures thereof. Most preferably, alicyclic diepoxide molecules having at least one alicyclic skeleton per molecule used in the transformative wavelength conversion medium of the present invention are selected from the group consisting of a diglycidyl ether of cis-1,3-cyclohexanedimethanol; a diglycidyl ether of trans-1,3-cyclohexanedimethanol; a diglycidyl ether of cis-1,4-cyclohexanedimethanol; a diglycidyl ether of trans-1,4-cyclohexanedimethanol; and, mixtures thereof.

Preferably, the aliphatic resin component used in the transformative wavelength conversion medium of the present invention when in an uncured state exhibits a viscosity of ≤100 millipascal second (mPa·s) at 25° C. (measured under the conditions set forth in the Examples). More preferably, the curable liquid component used in the transformative wavelength conversion medium of the present invention when in an uncured state exhibits a viscosity of 14.5 to 30 millipascal second (mPa·s) at 25° C. (measured under the conditions set forth in the Examples).

The curing agent used in the curable liquid component of the present invention is not particularly limiting. One of ordinary skill in the art will be able to select an appropriate curing agent for use in the curable liquid component of the present invention. Preferably, the curing agent is selected from the group consisting of catalytic curing agents, co-reactive curing agents, and mixtures thereof. Co-reactive curing agents (also referred to as hardeners or cross-linking agents) include, for example, anhydrides, carboxylic acids, amine compounds, phenols, mercaptans, and mixtures thereof. Particular co-reactive curing agents include, for example, polyamines, polyamides, polyaminoamides, dicyandiamides, polycarboxylic acids, polycarboxylic anhydrides, diaminodiphenylsulfone, styrene-maleic acid anhydride (SMA) copolymers and mixtures thereof. A preferred co-reactive curing agent is an anhydride (more preferably, carboxylic acid anhydrides; most preferably, an anhydride selected from the group consisting of methylhexahydrophthalic anhydride; nadic methyl anhydride; and, mixtures thereof). Catalytic curing agents include, for example, tertiary amines (including imidazoles), quaternary ammonium salts (e.g., quaternary ammonium halides), Lewis acids (e.g., boron trifluoride), Lewis acid-amine complexes, and mixtures thereof. Preferred catalytic curing agents include benzyl trialkylammonium halides (more preferably, benzyl triethylammonium chloride). Preferably, the curing agent is selected from the group consisting of methylhexahydrophthalic anhydride; nadic methyl anhydride; benzyl trialkylammonium halides; and, mixtures thereof. More preferably, the curing agent is selected from the group consisting of methylhexahydrophthalic anhydride; benzyl trialkylammonium halides; and, mixtures thereof. Most preferably, the curing agent is selected from the group consisting of methylhexahydrophthalic anhydride; benzyl triethylammonium chloride; and, mixtures thereof.

The transformative wavelength conversion medium of the present invention optionally further comprises an additive selected from the group consisting of a solvent, a cure accelerator, an antioxidant, a refractive index modifier (e.g., $TiO_2$), a nonreactive diluent, an epoxy resin diluent having at least two epoxide groups per molecule, a thickener, a reinforcing material, a filler, a pigment, a dye, a mold release agent, a wetting agent, a stabilizer, a thermal regulating agent, an optical dispersant (e.g., light scattering particles), a surfactant and mixtures thereof.

Optical dispersant optionally used in the transformative wavelength conversion medium of the present invention include light scattering particles. Preferably, the light scattering particles are dispersed in or around the curable liquid component, wherein the curable liquid component is either in an uncured or cured state. Preferred light scattering particles include yttrium oxide ($Y_2O_3$); barium sulfate ($BaSO_4$); zinc oxide (ZnO); alumina ($Al_2O_3$); niobium oxide ($Nb_2O_5$); tantalum oxide ($TaO_5$); silicon nitride ($Si_3N_4$); aluminum nitride; glass beads; diamond; zirconium dioxide ($ZrO_2$); silicon carbide (SiC) and boron nitride (BN).

Preferably, the transformative wavelength conversion medium of the present invention comprises 0.01 to 50 wt % of phosphor. More preferably, the transformative wavelength conversion medium of the present invention comprises 0.01 to 5 wt % of phosphor.

Preferably, the phosphor is combined with the curable liquid component by a blending or mixing process using equipment and techniques well known to one of ordinary skill in the art.

Preferably, the lighting devices of the present invention, comprise: a light source, wherein the light source produces light having a source luminescence spectrum; a phosphor; and, a cured curable liquid component, wherein the curable liquid component, comprises, as initial components: an aliphatic resin component, wherein the aliphatic resin component has an average of two epoxide groups per molecule; and, a curing agent (preferably, wherein the curing agent is selected from the group consisting of catalytic curing agents, co-reactive curing agents and mixtures thereof); wherein the curable liquid component contains less than 1 wt % (preferably, ≤0.5 wt %; more preferably, ≤0.3 wt %; still more preferably, ≤0.09 wt %; yet still more preferably, ≤0.01 wt %; most preferably, <the lower detectable limit) of monoepoxide molecules (based on the total weight of the aliphatic resin component); and, wherein the curable liquid component is a liquid at 25° C. and atmospheric pressure; and, wherein the phosphor is radiationally coupled to the light source. More preferably, the lighting devices of the present invention, comprise: a light source, wherein the light source produces light having a source luminescence spectrum; a phosphor; and, a cured curable liquid component, wherein the curable liquid component, comprises, as initial components: an aliphatic resin component, wherein the aliphatic resin component has an average of two epoxide groups per molecule; and, a curing agent (preferably, wherein the curing agent is selected from the group consisting of catalytic curing agents, co-reactive curing agents and mixtures thereof); wherein the curable liquid component contains less than 1 wt % (preferably, ≤0.5 wt %; more preferably, ≤0.3 wt %; still more preferably, ≤0.09 wt %; yet still more preferably, ≤0.01 wt %; most preferably, <the lower detectable limit) of monoepoxide molecules (based on the total weight of the aliphatic resin component); wherein the curable liquid component contains less than 1 wt % (preferably, ≤0.5 wt %; more preferably, ≤0.01 wt %; still more preferably, ≤0.001 wt %; most preferably, <the lower detectable limit) of polyepoxide molecules containing at least three epoxide groups per molecule (based on the total weight of the aliphatic resin component); and, wherein the curable liquid component is a liquid at 25° C. and atmospheric pressure; and, wherein the phosphor is radiationally coupled to the light source.

Preferably, the light source used in the lighting device of the present invention is a semiconductor light source. Preferably, the semiconductor light source is based on a Group I-V or Group II-VI quantum well structure. Specifically, the semiconductor light source is preferably based on structures comprising compounds that combine elements of the periodic table of the chemical elements from Group III with those from Group V or elements from Group II with those from Group VI.

Preferably, the lighting device of the present invention emits light. More preferably, the lighting device of the present invention emits light selected from the group consisting of white light, red light, green light, blue light, yellow light and magenta light.

Preferably, the phosphor is dispersed within the curable liquid component forming a transformative wavelength conversion medium used to produce an active layer in the lighting devices of the present invention upon curing of the curable liquid component. Preferably, the active layer is disposed directly or indirectly over a light emitting surface of the light source. Preferably, the active layer is disposed directly over a light emitting surface of the light source. Preferably, the active layer is disposed indirectly over a light emitting surface of the light source. Preferably, the active layer is provided with at least one featured surface to enhance the light emitted from the light device. For example, a surface of the active layer furthest from the light emitting surface of the light source can be structured to provide collimated light from the lighting device (e.g., for auto headlamp applications) or diffuse light from the lighting device (e.g., for solid state lighting applications) depending on the ultimate application for the lighting device.

Preferably, the lighting device of the present invention comprises a light emitting diode manufacturing assembly, comprising: a support structure having a plurality of individual semiconductor light emitting diode die light sources; and, a mold having a plurality of cavities corresponding with the plurality of individual semiconductor light emitting diode die light sources; wherein the plurality of cavities is filled with a transformative wavelength conversion medium of the present invention; and wherein the support structure and the mold are oriented such that the plurality of individual semiconductor light emitting diode die light sources are each at least partially immersed in the transformative wavelength conversion medium contained in the plurality of cavities. Preferably, each of the cavities in the plurality of cavities is in the shape of a lens. Preferably, the curable liquid component in the transformative wavelength conversion medium is heat curable (more preferably, wherein the curable liquid component is cured upon heating at 100 to 200° C. for 10 to 200 minutes). Preferably, the transformative wavelength conversion medium when cured encapsulates the individual semiconductor light emitting diode dies; functions as a lens; and, converts the source luminescence spectrum of the light source to the emitted spectrum of the lighting device, wherein the source luminescence spectrum and the emitted spectrum are different. The mold optionally further comprises a plurality of feed channels that facilitate injection of the transformative wavelength conversion medium in a liquid state into the plurality of cavities.

The light emitting diode manufacturing assembly of the present invention facilitates the manufacture of lighting devices comprising designed manifolds containing multiple individual semiconductor light emitting dies for use in, for example, automobile headlight assemblies. The light emitting diode manufacturing assembly of the present invention also facilitates the manufacture of individual semiconductor light emitting diode light source lighting devices. That is, upon curing of the curable liquid component in the transformative wavelength conversion medium, the mold can be separated from the assembly and the plurality of individual semiconductor light emitting diode die light sources encapsulated with the transformative wavelength conversion medium on the substrate can be diced into multiple individual lighting devices.

Some embodiments of the present invention will now be described in detail in the following Examples.

Example 1

Preparation of Aliphatic Resin Component

An aliphatic resin component having the following chemical structure

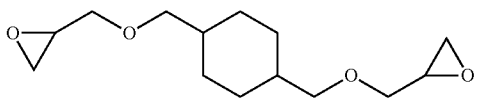 [SMILES: C1CC(COCC2CO2)CCC1COCC1CO1]

was prepared by the epoxidation reaction of 1,4-cyclohexanedimethanol (99%, mixture of cis and trans; product #125598 available from Sigma-Aldrich Co. LLC) ("CHDM") with epichlorohydrin by addition of sodium hydroxide in the presence of catalytic benzyltriethylammonium chloride. The resultant yellow colored, transparent, liquid epoxy resin (778.02 g) was then added to a one (1) liter, three (3) neck, round bottom, glass distillation pot equipped with a magnetic stirrer, a thermometer for monitoring the internal distillation pot temperature, a temperature controller coupled with a heating mantle placed under the distillation pot reactor and a thermocouple placed in the center surface of the heating mantle, a distillation column comprising a one piece integral vacuum jacketed Vigreux distillation column with a distillation head was attached to a second section of vacuum jacketed Vigreux distillation column through the respective 24/40 joints on both columns. The distillation head was equipped with an overhead thermometer, an air cooled condenser, a receiver and a vacuum takeoff. Clean receivers were used for each distillation cut. A vacuum pump was employed along with a liquid nitrogen trap and an in-line digital thermal conductivity vacuum gauge. The contents of the distillation pot were then subjected to a fractional vacuum distillation process. Eight distillation cuts were taken during the fractional vacuum distillation process. The eighth distillation cut provided 442.45 g of the product aliphatic resin component as a colorless liquid.

Titration of portions of the diglycidyl ether product from the eighth distillation cut demonstrated an average epoxide equivalent weight (EEW) of 131.67.

The viscosity of the product aliphatic resin component was determined using an I.C.I. Cone and Plate Viscometer (model VR-4540) at 25°–C; equipped with a 0-5 poise spindle (model VR-4105); equilibrated to 25° C. and calibrated to zero. A sample of the product aliphatic resin component was applied to the viscometer and held for 2 min, then the viscosity was checked and the reading was taken after 15 seconds. Five duplicate viscosity tests were completed using fresh aliquots of the product aliphatic resin component. The measurements were averaged to 27 cP.

The product aliphatic resin component was then analyzed demonstrating no detectable monoglycidyl ethers of cis- and trans-1,4-cyclohexanedimethanol, 99.20 wt % diglycidyl ethers of cis- and trans-1,4-cyclohexanedimethanol, 0.80 wt % of a minor peak associated with the diglycidyl ether peaks, and no detectable oligomers (principly triglycidyl ethers) using a Hewlett Packard 5890 Series 11 Gas Chromatograph outfitted with a 60m×0.248 mm×0.25 μm film thickness J&W GC column using a DB-1 stationary phase. The flame ionization detector was operated at 300° C. The injector temperature was maintained at 300° C. Helium carrier gas flow through the column was maintained at 1.1 mL per min. For the analysis, an initial 50° C. oven temperature with heating at 12° C. per min to a final temperature of 300° C. was used.

Comparative Example C1 and Examples 2-3

Preparation Cured Transformative Wavelength Conversion Medium

Two (2) grams of the aliphatic resin component prepared according to Example 1 was weighed into a 50 mL vial for each of Comparative Example C1 and Examples 2-3. The phosphor identified in TABLE 1 was then mixed with the aliphatic resin component in the amount stated for each of Comparative Example C1 and Examples 2-3.

TABLE 1

| Ex. # | phosphor | phosphor added (wt %) |
|---|---|---|
| C1 | — | — |
| 2 | green phospho.※ | 1.0 |
| 3 | quantum dot※ | 0.06 |

※F550 green oxycarbonitride phosphor available from Lightscape Materials, Inc. (having a formula $M(II)_7Al_{12-y}Si_{x+y}O_{25-x}N_{x-y}C_y$: A);
※CdSe/ZnS green quantum dot solution (5 mg/mL toluene/aliphatic amine) available from Sigma-Aldrich (product # 731838).

For each of Comparative Example C1 and Examples 2-3, a separate 50 mL vial was loaded with 0.15 g of benzyl triethylammonium chloride ("BTEAC") curing catalyst (available from Sigma-Aldrich Co. LLC). Then 4 g of methylhexahydrophthalic anhydride ("MHHPA") co-reactive curing agent (available from Dixie Chemical Company) was added to each 50 mL vial. The contents of each of the vials were then heated at 60° C. under an infra red lamp for 15 minutes with continued stirring. The vials were then removed from the heat source and allowed to cool for 10 minutes with continuous stirring to form a catalyst/curing agent mixture.

The catalyst/curing agent mixture was then combined with the aliphatic resin component/phosphor with stirring to form a transformative wavelength conversion medium. The transformative wavelength conversion mediums for each of Comparative Example C1 and Examples 2-3 where then placed in a desiccator, purged with nitrogen for 10 minutes, and then degassed by connecting the desiccator with a vacuum pump until no gas bubbles were observed (over a period of 15 minutes) in the respective transformative wavelength conversion mediums. Each of the degassed transformative wavelength conversion mediums was then poured into a separate 2 inch by 2 inch by 1 mm deep Teflon mold under a nitrogen atmosphere and cured into films by placing the films in a convection oven and using the temperature profile shown in TABLE 2. Each of the cured films was then analyzed for photoluminescence yield, light transmittance, and film haze. The results are reported in TABLE 3 along with photoluminescence yield data for the phosphor material alone.

TABLE 2

| Time (min) | Temperature (° C.)[a] |
|---|---|
| 30 | 80 |
| 30 | 90 |
| 30 | 100 |
| 30 | 120 |
| 30 | 140 |
| 30 | 160 |

[a] temperature set point for the convection oven

The light transmittance and haze were measured at 450 nm using a UV-3600 Shimadzu spectrometer. The % haze reported in TABLE 3, was measured directly using the spectrometer. The % total transmittance (% $T_T$) reported in TABLE 3 was calculated with the following expression:

% $T_T$ = % $T_M$/(100 − % BS)

wherein % $T_M$ is the transmittance directly measured using the spectrometer and % BS is the % back scatter directly measured using the spectrometer.

The photoluminescence yield was measured using QuantaMaster 40 spectrophotometer (Photon Technologies International Birmingham, N.J.).

TABLE 3

| Ex. # | % $T_T$ | % haze | Photoluminescence yield (%) |
|---|---|---|---|
| C1 | 91.3 | 23.2 | — |
| Green phosphor[a] | — | — | 85.0 |
| quantum dot[b] | — | — | 93.0 |
| 2 | 87.0 | 27.7 | 87.6 |
| 3 | 90.8 | 19.0 | 37.5 |

[a] F550 green oxycarbonitride phosphor available from Lightscape Materials, Inc. (having a formula $M(II)_7Al_{12-x-y}Si_{x+y}O_{25-x}N_{x-y}C_y$: A);
[b] CdSe/ZnS green quantum dot solution (5 mg/mL toluene/aliphatic amine) available from Sigma-Aldrich (product # 731838).

Thermal Aging Studies

Samples cut from the cured films prepared according to Comparative Example C1 and Examples 2-3 were subjected to accelerated aging, wherein the samples were placed in a convection oven set at 125° C. for seven days under air. No color change between the oven treated portion and untreated portion of the cured films was apparent by visual inspection.

Example 4

Master Batch of Catalyst/Curing Agent Mixture

The catalyst/curing agent mixture used in each of Comparative Examples C2-C4 and Example 5 was prepared by loading a 50 mL vial with 0.966 g of benzyl triethyl ammonium chloride ("BTEAC") catalyst (available from Sigma-Aldrich Co. LLC) and 21.96 g of methylhexahydrophthalic anhydride ("MHHPA") curing agent (available from Dixie Chemical Company). A magnetic stir bar was placed in the vial. The vial and its contents were then placed on a thermostatically controlled hotplate set at 65° C. under a nitrogen atmosphere with magnetic stirring provided to the vial contents. The vial and its contents were then removed from the heat source and allowed to cool to room temperature.

Example 5

Cured Film from Curable Liquid Component

A portion (3.4 g) of the aliphatic resin component prepared according to Example 1 was added to a 20 mL vial containing a portion (4.5 g) of a catalyst/curing agent mixture prepared according to Example 4 with stirring under nitrogen to form a curable liquid component. The 20 mL vial and its contents were then placed in a desiccator and degassed for 20 minutes by connecting the desiccator with a vacuum pump until no gas bubbles were observed in the curable liquid component. The degassed curable liquid component was then poured into a 2 inch by 2 inch by 1 mm deep polytetrafluoroethylene mold and cured into a film under nitrogen using the temperature profile shown previously in TABLE 2.

Comparative Examples C2

Cured Film from Curable Liquid Component

A portion (3.4 g) of an aliphatic resin component was added to a 20 mL vial containing a portion (3.6 g) of the catalyst/curing agent mixture of Example 4 with stirring under nitrogen to form a curable liquid component. The aliphatic resin component used in this Example was prepared by epoxidation reaction of a cis- and trans-1,4-cyclohexanedimethanol with epichlorohydrin by addition of sodium hydroxide in the presence of catalytic benzyltriethyl ammonium chloride. Externally calibrated gas chromatographic analysis demonstrated the presence of 0.33 wt % cis- and trans-1,4-cyclohexanedimethanol; 11.18 wt % monoglycidyl ethers of cis- and trans-1,4-cyclohexanedimethanol; and 54.38 wt % diglycidyl ethers of cis- and trans-1,4-cyclohexanedimethanol with the balance (34.11 wt %) as oligomers (principally triglycidyl ethers). Titration of portions of the aliphatic resin product demonstrated an average EEW of 158.54. The 20 mL vial and its contents were then placed in a desiccator, and degassed for 20 minutes by connecting the desiccator with a vacuum pump until no gas bubbles were observed in the curable liquid component. The degassed curable liquid component was then poured into a 2 inch by 2 inch by 1 mm deep polytetrafluoroethylene mold and cured into a film under nitrogen using the temperature profile shown previously in TABLE 2.

Comparative Example C3

Cured Films from Curable Liquid Components

A portion (3.0 g) of the aliphatic resin component of Example 1 and monoglycidyl ethers of cis- and trans-1,4-cyclohexanedimethanol (0.16 g) were added to a 20 mL vial and mixed to for a resin mixture. The monoglycidyl ethers of cis- and trans-1,4-cyclohexanedimethanol used were a fractionally vacuum distilled product of 96.07 wt % purity. Titration of portions of the mixture demonstrated an average EEW of 131.7. A portion (2.7 g) of the resin mixture was added to another 20 mL vial containing a portion (3.4 g) of the catalyst/curing agent mixture of Example 4 with stirring under a nitrogen to form a curable liquid component. The 20 mL vial and its contents were then placed in a desiccator, and degassed for 20 minutes by connecting the desiccator with a vacuum pump until no gas bubbles were observed in the curable liquid component. The degassed curable liquid component was then poured into a 2 inch by 2 inch by 1 mm deep polytetrafluoroethylene mold and cured into a film under nitrogen using the temperature profile shown previously in TABLE 2.

Comparative Example C4

Cured Film from Curable Liquid Component

A portion (3.0 g) of the aliphatic resin component of Example 1 and monoglycidyl ethers of cis- and trans-1,4-cyclohexanedimethanol (0.3613 gram) were added to a 20 mL vial to form a resin mixture. The monoglycidyl ethers of cis- and trans-1,4-cyclohexanedimethanol used were a fractionally vacuum distilled product of 96.07 wt % purity. Titration of portions of the mixture demonstrated an average EEW of 134.6. A portion (2.9 g) of the mixture of monoglycidyl and diglycidyl ethers was added to a 20 mL vial containing a portion (3.6 g) of the catalyst/curing agent mixture of Example 4 with stirring under nitrogen to form a curable liquid component. The 20 mL vial and its contents were then placed in a desiccator, and degassed for 20 minutes by connecting the desiccator with a vacuum pump until no gas bubbles were observed in the curable liquid component. The degassed curable liquid component was then poured into a 2 inch by 2 inch by 1 mm deep polytetrafluoroethylene mold and cured into a film under nitrogen using the temperature profile shown previously in TABLE 2.

Yellowness Index of Cured Films

The cured films prepared according to Comparative Examples C2-C4 and Example 5 were analyzed for yellowness index (YI). The yellowness index of each of the cured films and a standard white tile were measured using a ColorQuest XE dual beam spectrophotometer (Column YI E313-98) according to ASTM E313-10. The results are provided in TABLE 4.

TABLE 4

| Ex. # | X | Y | Z | YI |
|---|---|---|---|---|
| C2 | 65.03 | 70.18 | 57.22 | 26.84 |
| C3 | 66.28 | 70.84 | 58.67 | 26.40 |
| C4 | 66.20 | 70.61 | 59.98 | 24.33 |
| 5 | 70.76 | 75.26 | 77.14 | 4.50 |
| Standard | 79.20 | 84.18 | 90.36 | −1.00 |

Differential Scanning Calorimetry of Cured Films

Portions of the cured films prepared according to Comparative Examples C2-C4 and Example 5 were analyzed by differential scanning calorimety using a DSC 2910 Modulated DSC (TA Instruments) instrument. A heating rate of 7° C. per min from 0° C. to 200° C. was used under a stream of nitrogen flowing at 35 cubic centimeters per minute. Each respective cured sample for analysis of Tg was cut from the original casting and then contained in an open aluminum pan. A second scan of each sample was repeated under the aforementioned conditions. The average results for the duplicate scans are provided in TABLE 5.

TABLE 5

| Ex. # | $T_g$ (° C.) |
|---|---|
| C2 | 73.3 |
| C3 | 95.0 |
| C4 | 91.6 |
| 5 | 90.4 |

We claim:
1. A transformative wavelength conversion medium, comprising:
   a phosphor dispersed in a curable liquid component;
   wherein the curable liquid component, comprises: a curing agent and an aliphatic resin component;
   wherein the aliphatic resin component has an average of two epoxide groups per molecule and contains ≥95 wt % of alicyclic diepoxide molecules having two glycidyl ether groups per molecule and at least one alicyclic skeleton per molecule, less than 0.5 wt % of alicyclic monoepoxide molecules having one glycidyl ether group per molecule and said at least one alicyclic skeleton per molecule, and less than 1 wt % of alicyclic polyepoxide molecules having at least three glycidyl ether groups per molecule and said at least one alicyclic skeleton per molecule, all based on the total weight of the aliphatic resin component; and
   wherein the curable liquid component is a liquid at 25° C. and atmospheric pressure.
2. The transformative wavelength conversion medium of claim 1, wherein the alicyclic diepoxide molecules having two glycidyl ether groups per molecule and at least one alicyclic skeleton per molecule are selected from the group consisting of diglycidyl ethers of molecules according to formula (I)

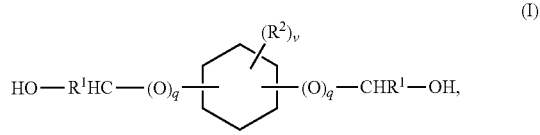

molecules according to formula (II)

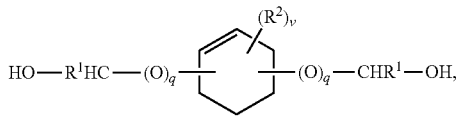
(II)

molecules according to formula (III)

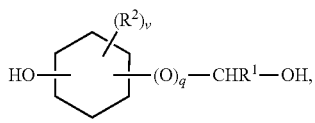
(III)

molecules according to formula (IV)

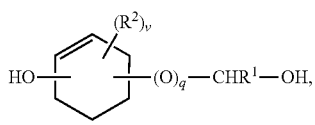
(IV)

molecules according to formula (V)

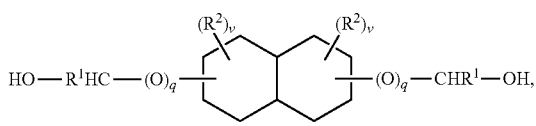
(V)

molecules according to formula (VI)

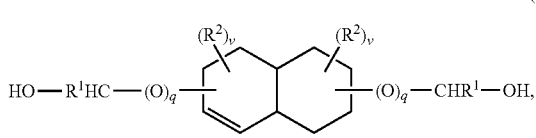
(VI)

molecules according to formula (VII)

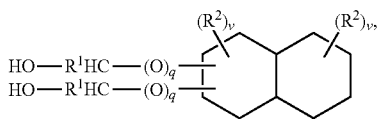
(VII)

molecules according to formula (VIII)

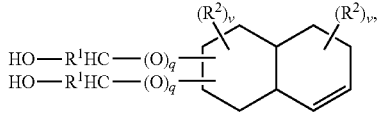
(VIII)

molecules according to formula (IX)

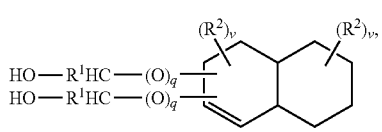
(IX)

molecules according to formula (X)

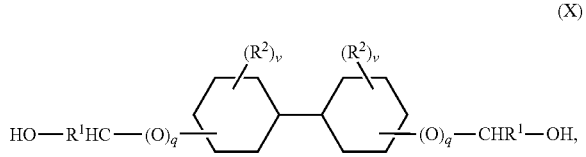
(X)

molecules according to formula (XI)

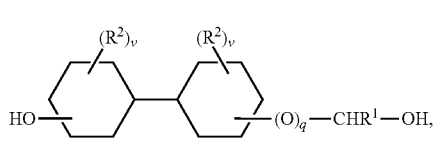
(XI)

molecules according to formula (XII)

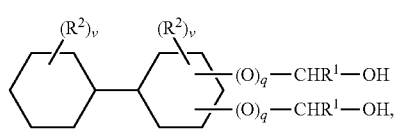
(XII)

molecules according to formula (XIII)

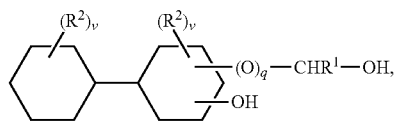
(XIII)

molecules according to formula (XIV)

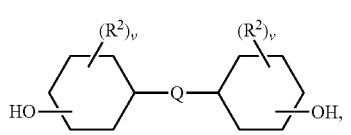
(XIV)

and
mixtures thereof; wherein each $R^1$ is independently selected from the group consisting of a H, a $C_{1-6}$ hydrocarbyl group and a $C_{1-6}$ hydrocarbylene group; wherein each $R^2$ is independently selected from the group consisting of a $C_{1-12}$ hydrocarbyl group, a $C_{1-12}$ alkoxy group and a $C_{1-12}$ oxo organyl group; wherein Q is a bridging group selected from the group consisting of $C_{1-12}$ alkylene group, an arylene group, an oxygen, a sulfur, an —O=S=O— group, an —S(O)— group, an —C(O)— group and an —($R^3$)N(C=O)— group; where $R^3$ is selected from the group consisting of a hydrogen and a $C_{1-6}$ alkyl group; wherein each q is independently selected from the group consisting of 0 and 1; and wherein each v is independently selected from the group consisting of 0, 1 and 2.

3. The transformative wavelength conversion medium of claim 2, wherein the alicyclic diepoxide molecules having two glycidyl ether groups per molecule and at least one alicyclic skeleton per molecule are selected from the group consisting of diglycidyl ethers of molecules according to formula (I)

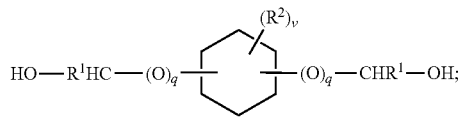

and
mixtures thereof.

4. The transformative wavelength conversion medium of claim 3, wherein the alicyclic diepoxide molecules having two glycidyl ether groups per molecule and at least one alicyclic skeleton per molecule are selected from the group consisting of a diglycidyl ether of cis-1,3-cyclohexanedimethanol; a diglycidyl ether of trans-1,3-cyclohexanedimethanol; a diglycidyl ether of cis-1,4-cyclohexanedimethanol; a diglycidyl ether of trans-1,4-cyclohexanedimethanol; and mixtures thereof; and wherein the curing agent is selected from the group consisting of methylhexahydrophthalic anhydride; benzyl triethylammonium halides; and mixtures thereof.

5. The transformative wavelength conversion medium of claim 1, wherein the phosphor is selected from the group consisting of a quantum dot and a material having a formula

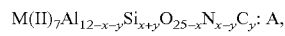

wherein:
$0 < x \leq 12$;
$0 < y < x$;
$0 < x+y \leq 12$; and
M(II) comprises at least one divalent cation.

6. The transformative wavelength conversion medium of claim 1, further comprising an additive selected from the group consisting of a solvent, a cure accelerator, an antioxidant, a refractive index modifier, a nonreactive diluent, an epoxy resin diluent having at least two epoxide groups per molecule, a thickener, a reinforcing material, a filler, a pigment, a dye, a mold release agent, a wetting agent, a stabilizer, a thermal regulating agent, an optical dispersant, a surfactant, and mixtures thereof.

7. A lighting device, comprising:
a light source, wherein the light source produces light having a source luminescence spectrum; and
an active layer, wherein the active layer comprises the transformative wavelength conversion medium of claim 1 in a cured state;
wherein the phosphor is radiationally coupled to the light source.

* * * * *